(12) United States Patent
Esteve et al.

(10) Patent No.: US 9,029,974 B2
(45) Date of Patent: May 12, 2015

(54) SEMICONDUCTOR DEVICE, JUNCTION FIELD EFFECT TRANSISTOR AND VERTICAL FIELD EFFECT TRANSISTOR

(71) Applicant: Infineon Technologies AG, Neubiberg (DE)

(72) Inventors: Romain Esteve, Treffen am Ossiacher See (AT); Jens Konrath, Villach (AT); Daniel Kueck, Villach (AT); David Laforet, Villach (AT); Cedric Ouvrard, Villach (AT); Roland Rupp, Lauf (DE); Andreas Voerckel, Villach (AT); Wolfgang Werner, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/023,819

(22) Filed: Sep. 11, 2013

(65) Prior Publication Data

US 2015/0069411 A1    Mar. 12, 2015

(51) Int. Cl.
*H01L 29/47*  (2006.01)
*H01L 29/78*  (2006.01)
*H01L 29/06*  (2006.01)
*H01L 29/812* (2006.01)
*H01L 29/872* (2006.01)

(52) U.S. Cl.
CPC ............ *H01L 29/7827* (2013.01); *H01L 29/06* (2013.01); *H01L 29/812* (2013.01); *H01L 29/872* (2013.01)

(58) Field of Classification Search
CPC ... H01L 29/7827; H01L 29/06; H01L 29/105; H01L 29/812; H01L 29/872; H01L 29/8083; H01L 29/66909; H01L 21/0475; H01L 21/0485; H01L 21/0495
See application file for complete search history.

(56) References Cited

U.S. PATENT DOCUMENTS 5,262,669 A * 11/1993 Wakatabe et al. ............ 257/483
6,362,495 B1 * 3/2002 Schoen et al. .................. 257/77
(Continued)

FOREIGN PATENT DOCUMENTS

| DE | 10161139 B4 | 7/2004 |
|---|---|---|
| DE | 102008047998 A1 | 4/2009 |
| WO | 0122498 A1 | 3/2001 |

OTHER PUBLICATIONS

Okumura, K., et al., "Ultra Low On-Resistance SiC Trench Devices," Power Electronics Europe, Jun. 21, 2012, pp. 22-25, Issue 4.

*Primary Examiner* — Benjamin Sandvik
*Assistant Examiner* — Farid Khan
(74) *Attorney, Agent, or Firm* — Murphy, Bilak & Homiller, PLLC

(57) ABSTRACT

A semiconductor device according to an embodiment is at least partially arranged in or on a substrate and includes a recess forming a mesa, wherein the mesa extends along a direction into the substrate to a bottom plane of the recess and includes a semiconducting material of a first conductivity type, the semiconducting material of the mesa including at least locally a first doping concentration not extending further into the substrate than the bottom plane. The semiconductor device further includes an electrically conductive structure arranged at least partially along a sidewall of the mesa, the electrically conductive structure forming a Schottky or Schottky-like electrical contact with the semiconducting material of the mesa, wherein the substrate comprises the semiconducting material of the first conductivity type comprising at least locally a second doping concentration different from the first doping concentration along a projection of the mesa into the substrate.

17 Claims, 7 Drawing Sheets

(56) References Cited

U.S. PATENT DOCUMENTS

| | | | |
|---|---|---|---|
| 6,979,863 B2 | 12/2005 | Ryu | |
| 2009/0078971 A1* | 3/2009 | Treu et al. | 257/263 |
| 2012/0248530 A1* | 10/2012 | Lui et al. | 257/334 |
| 2012/0256195 A1 | 10/2012 | Aketa | |
| 2013/0001699 A1* | 1/2013 | Tai et al. | 257/368 |
| 2013/0105820 A1 | 5/2013 | Konishi et al. | |
| 2013/0161779 A1* | 6/2013 | Qu et al. | 257/471 |

* cited by examiner

SEMICONDUCTOR DEVICE, JUNCTION FIELD EFFECT TRANSISTOR AND VERTICAL FIELD EFFECT TRANSISTOR

FIELD

Embodiments relate to a semiconductor device, a junction field effect transistor (JFET) and a vertical field effect transistor (vertical FET).

BACKGROUND

In many semiconductor devices, diode-like structures are used for different purposes, for instance, to protect an active region of a semiconductor device. In terms of their current-voltage characteristics, diode-like structures typically comprise a forward-biased threshold voltage and a characteristic reverse voltage in a reverse-biased state, above which a leakage current starts to increase significantly.

Typically, a tendency exists to reduce the threshold voltage in the forward-biased state, while the characteristic reverse voltage in the reverse-biased state is to be raised. Naturally, further boundary conditions including process control of the manufacturing process, available space on a substrate of the semiconductor device and other technical restrictions may pose further boundary conditions onto the layout of a semiconductor device and its fabrication process.

SUMMARY

Therefore, a demand exists to improve a trade-off between a performance of a semiconductor device and fabrication-related boundary conditions.

A semiconductor device according to an embodiment is at least partially arranged in or on a substrate. The semiconductor device comprises a recess forming a mesa, such that the mesa extends along a direction into the substrate to a bottom plane of the recess. The mesa comprises a semiconducting material of a first conductivity type, wherein the semiconducting material of the mesa comprises at least locally a first doping concentration not extending further into the substrate than the bottom plane. The semiconductor device further comprises an electrically-conductive structure arranged at least partially along a sidewall of the mesa. The electrically-conductive structure forms a Schottky or Schottky-like electrical contact with a semiconducting material of the mesa, wherein the substrate comprises the semiconducting material of the first conductivity type comprising at least locally a second doping concentration different from the first doping concentration along a projection of the mesa into the substrate.

A junction field effect transistor (JFET) according to an embodiment is arranged at least partially in or on a substrate. The JFET comprises a recess forming a mesa, the mesa extending along a direction into the substrate to a bottom plane of the recess. The mesa comprises a semiconducting material of a first conductivity type. The JFET further comprises an electrically-conductive structure arranged at least partially along a sidewall of the mesa, wherein the electrically-conductive structure forms a Schottky or Schottky-like electrical contact with the semiconducting material of the mesa. The JFET further comprises a doped region of a second conductivity type arranged at least partially adjacent to the bottom plane of the recess along a projection into the substrate such that the mesa is accessible by charge carriers avoiding the doped region. The JFET further comprises a drain contact and a drift area, wherein the drift area comprises the semiconducting material of the first conductivity type. The drift area is arranged along the direction into the substrate between the drain contact and the electrically-conductive structure. The JFET further comprises a source region electrically coupled to the electrically-conductive structure and comprises the semiconducting material of the first conductivity type. The source region is shut off from the drift area by a semiconductor region of the second conductivity type at least partially formed by the doped region. Furthermore, the JFET comprises a gate stack arrangement comprising a first layer of a first conductivity type, a second layer of the second conductivity type and a gate contact. The second layer is arranged between the first layer and the gate contact. The first layer is in contact with a source region and the semiconductor region of the second conductivity type.

A vertical field effect transistor (FET) according to an embodiment is arranged at least partially in or on a substrate. The vertical FET comprises a recess forming a mesa, wherein the mesa extends along a direction into the substrate to a bottom plane of the recess. The mesa comprises a semiconducting material of a first conductivity type. The vertical FET further comprises an electrically-conductive structure arranged at least partially along a sidewall of the mesa. The electrically-conductive structure forms a Schottky or Schottky-like electrical contact with the semiconducting material of the mesa. The vertical FET further comprises a doped region of a second conductivity type arranged at least partially adjacent to the bottom plane of the recess along a projection into the substrate such that the mesa is accessible by charge carriers avoiding the doped region. It further comprises a drain contact and a drift area, wherein the drift area comprises the semiconducting material of the first conductivity type. The drift area is arranged along the direction into the substrate between the drain contact and the electrically-conductive structure. The vertical FET further comprises a source region electrically coupled to the electrically-conductive structure and comprises the semiconducting material of a first conductivity type. It further comprises a channel region comprising the semiconducting material of the second conductivity type and is arranged along the direction into the substrate between the source region and the drift area. The vertical FET further comprises a gate contact arranged in a trench extending into the substrate, wherein the gate contact is electrically insulated from the source region, the channel region and the drift area by an insulating film covering at least partially a sidewall and a bottom of the trench. The source region is arranged in a direction perpendicular to the direction into the substrate between the trench and the doped region. The channel region is at least partially arranged in the direction perpendicular to the direction into the substrate between the trench and the doped region.

Embodiments are based on the finding that a trade-off between a performance of the semiconducting device and a manufacturing process may be improved by employing a Schottky or Schottky-like electrical contact being formed at least partially along a sidewall of the mesa or the recess. The trade-off may further be improved by using a first doping concentration at least locally for the semiconducting material comprised in the mesa compared to a second doping concentration used below the bottom plane of the recess, but along the projection of the mesa into the substrate.

BRIEF DESCRIPTION OF THE DRAWINGS

Several embodiments of the present invention will be described in the enclosed Figures.

DETAILED DESCRIPTION

Figure 1:
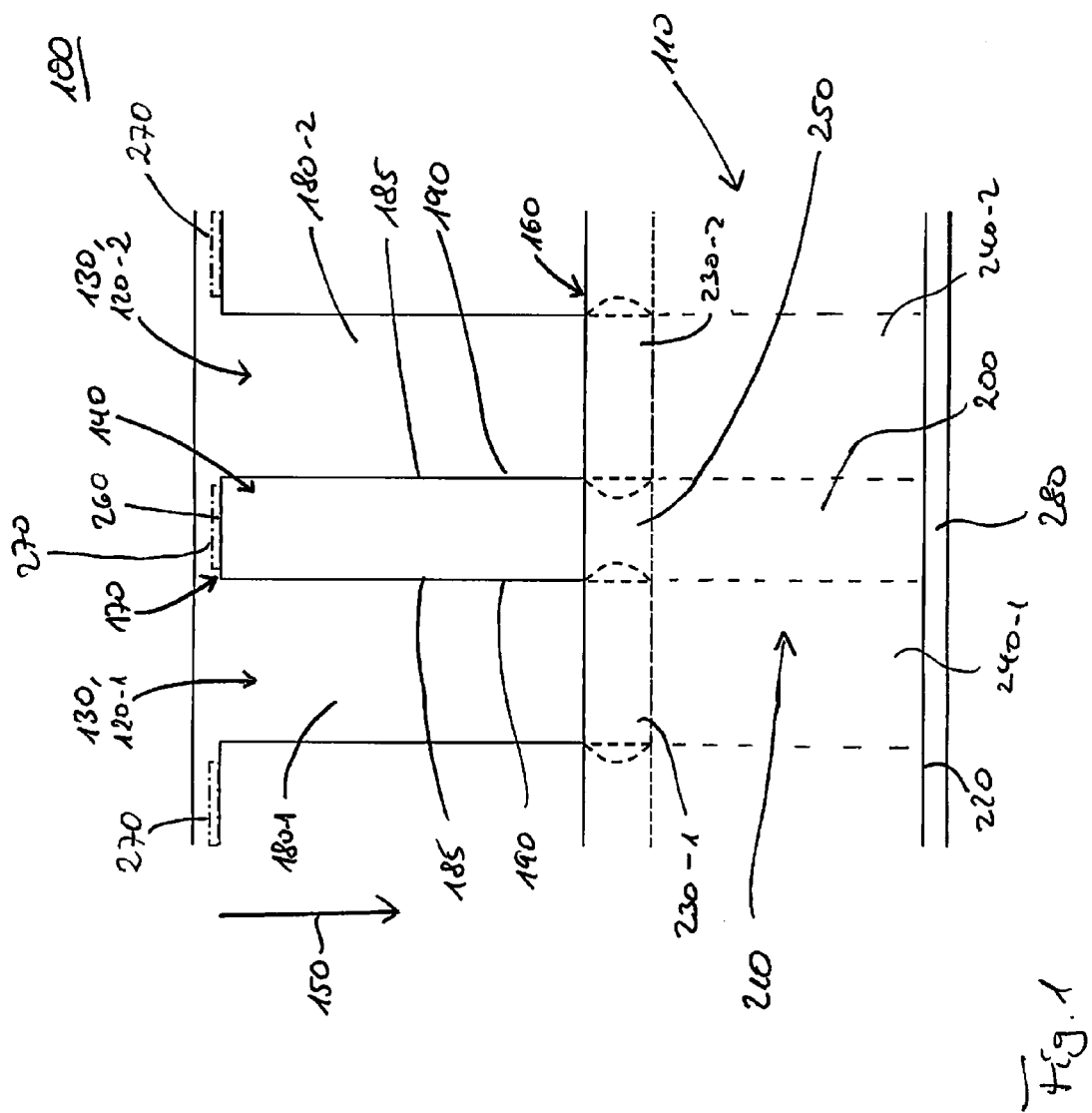
FIG. 1 shows a cross-sectional view of a semiconductor device according to an embodiment.

In the following, embodiments according to the present invention will be described in more detail. In this context, summarizing reference signs will be used to describe several objects simultaneously or to describe common features, dimensions, characteristics, or the like of these objects. The summarizing reference signs are based on their individual reference signs. Moreover, objects appearing in several embodiments or several figures, but which are identical or at least similar in terms of at least some of their functions or structural features, will be denoted with the same or similar reference signs. To avoid unnecessary repetitions, parts of the description referring to such objects also relate to the corresponding objects of the different embodiments or the different figures, unless explicitly or —taking the context of the description and the figures into account—implicitly stated otherwise. Therefore, similar or related objects may be implemented with at least some identical or similar features, dimensions, and characteristics, but may be also implemented with differing properties.

Diode-like structures are widely used in semiconductor devices. They are, for instance, used to protect other active areas of semiconductor devices, but may also be used as stand-alone electric elements in circuits which may, optionally, be implemented as integrated circuits. Naturally, diode-like structures may also be used in integrated and non-integrated form in more complex circuits comprising discrete circuit elements and/or integrated circuits.

Diode-like structures may comprise a current-voltage characteristic (IVC) which allows a current to flow through the structure in a forward-biased state, once a threshold voltage is reached or exceeded. In a reverse-biased state, typically a current flow is suppressed until a characteristic reverse voltage, is reached or exceeded. Often, it is desired to obtain low threshold voltages in the forward-biased state and high characteristic reverse voltage in the reverse-biased state. In the reverse-biased state at voltages below the characteristic reverse voltage and/or in the below the threshold voltage in the forward-biased state, the current may, for instance, be exponentially suppressed.

Although embodiments may be implemented essentially using any semiconducting material, in the following a main emphasis is laid on silicon carbide (SiC) diodes fabricated or formed in or on a substrate comprising silicon carbide. Correspondingly, the semiconducting material widely used may also be silicon carbide. However, it is to be noted that this merely represents an example. Other embodiments may also be formed based on other semiconducting materials, such as silicon (Si), III-V semiconductor materials and II-VI semiconductor materials, to name just a few examples.

Silicon carbide diodes are typically used today in high voltage applications requiring the semiconductor devices to withstand high voltages of 100 V or more. Naturally, semiconductor devices based on silicon carbide may also be used for smaller or even higher voltages.

Conventionally, silicon carbide Schottky diodes typically have threshold voltages in the range between 0.8 V and 1.0 V. These relatively high threshold voltages may cause comparably high static losses when using and implementing these devices in applications employing a low power regime. In these applications, the forward-biased threshold voltage may be a substantial part, sometimes even the largest part of the forward-biased voltage drop caused by the respective device. For instance, Schottky diodes may have a forward voltage drop of approximately 1.4 V at their nominal current, of which approximately 1.0 V are caused at the Schottky barrier.

Therefore, a demand exists to reduce the forward-biased threshold voltage to increase the performance without significantly causing an increase of the differential resistance, leakage currents or the like. In the case of a stand-alone three-dimensional silicon carbide Schottky diode, to reduce the forward-biased threshold voltage a metal with a reduced Schottky barrier may be used.

Reducing the Schottky barrier may, for instance, be achieved by choosing a suitable metal, for instance, molybdenum (Mo), tungsten (W), tantalum (Ta) or hafnium (Hf) instead of titanium (Ti). Besides the pure metals also conductive metal compounds like metal nitrides or metal carbides may be used. Additionally or alternatively, p-doped or n-doped silicon (Si) may also be used. Moreover, ion implantation techniques may be used to create a surface near doping region, which may lead to a significant increase of leakage currents. To reduce the leakage currents, a relief of an electrical field at the Schottky interface may be implemented by integrating merged pn-Schottky structures which are also referred to as MPS. They may for instance comprise a mesa structure implemented with materials having different Schottky barriers. For instance, a material with a higher Schottky barrier may be used at the sidewall, while at a top area of the mesa a material with a lower Schottky barrier may be used. Introducing the doped areas may allow to pinch-off the mesa in the reverse-biased state. Therefore, an electric field strength at the Schottky or Schottky-like electrical contact may be limited.

The electrically-conductive structure 180 and the semiconducting material of the mesa 140 may be configured such that both, a Schottky and a Schottky-like electric contact 185 between the electrically-conductive structure 180 and the semiconducting material of the mesa 140 is established, for instance, by implementing the top region 270 with different material. The term Schottky-like electrical contact, therefore, also comprises more traditional Schottky electric contacts.

In the case of a three-dimensional silicon carbide Schottky diode integrated within a silicon carbide active switch, it may be desirable to improve a performance of, for instance, a body diode integrated into silicon carbide active switches, which may be unfavorable or even unsuitable due to a large band gap, in which the body diode conduction may be used. This operation is also referred to as the third quadrant of operation. To improve this, an external silicon carbide Schottky diode may be implemented, which may cause a form factor to increase in the case of a non-monolithic implementation. This may result in a more complex fabrication process and in increased costs.

FIG. 1 shows a cross-sectional view of a semiconductor device 100 according to an embodiment. The semiconductor device 100 is at least partially arranged in or on a substrate 110.

The semiconductor 100 comprises a recess 120 in the form of a trench 130. The recess 120 may be at least partially formed by a trench 130 in the semiconducting substrate 110. To be a little more specific, the semiconductor 100 as shown in FIG. 1 comprises a plurality of—in other words—more than one recesses 120, of which FIG. 1 shows a first recess 120-1 and a second recess 120-2. The recesses 120 form one or more mesas 140, which extend along a direction 150 into the substrate 110 to a bottom plane 160 of the recesses 120.

The mesa 140 comprises a semiconducting material of a first conductivity type. The semiconducting material may be, for instance, silicon carbide (SiC), silicon (Si) or any other semiconducting material such as III-V semiconducting materials and II-VI semiconducting materials. The first conductivity type may be, for instance, an n-type created, for instance, by doping the respective semiconducting materials accordingly. In this case, a second conductivity type may be a p-doped semiconducting material. Naturally, in other embodiments, the role of the first and second conductivity types may be exchanged with respect to one another.

The semiconducting material of the mesa 140 comprises at least locally a first doping concentration N1 which does not extend further into the substrate 110 along the direction 150 than the bottom plane 160. The semiconducting material of the mesa 140 may take on a doping concentration different from the first doping concentration above the bottom plane 160 or —in other words—closer to a top region 170 of the mesa 140.

The direction 150, which is also referred to as the vertical direction or z-direction, is typically arranged perpendicular to a main surface of the substrate 110. The substrate 110 may, for instance, be a semiconductor die having, for instance, an essentially cubic shape with dimensions along a first direction, which is also referred to as an x-direction, and a second direction, also referred to as y-direction, being significantly larger than along the direction 150 perpendicular to both the first and second directions. Often, the substrate 110 comprises a thickness along the direction 150 being at least a factor of 5, at least a factor of 10, at least a factor of 20, at least a factor of 50 or at least a factor of 100 smaller than any of the directions along the first and second directions. The main surface may, for instance, be a top surface of the substrate before the processing. For instance, in the case of a semiconductor device 100 according to an embodiment, the top regions 170 of the mesas 140 may optionally be part of the main surface.

The semiconducting device 100 further comprises an electrically-conductive structure 180-1, 180-2 arranged at least partially along a sidewall 190 of the mesa 140. The electrically-conductive structure 180 forms a Schottky or Schottky-like electrical contact 185 with a semiconducting material of the mesa 140. The Schottky or Schottky-like electrical contact 185 may comprise a diode-like current-voltage characteristic (IVC) with a threshold voltage in a forward-biased state and a characteristic reverse voltage in a reverse-biased state. When a voltage applied to the electrical contact reaches or surpasses the threshold voltage in the forward-biased state, the current flowing through the electrical contact rises significantly, leading to a significant reduction of a differential resistance, while the voltages below the threshold voltage in the forward-biased state, the current flow is essentially, for instance exponentially, suppressed.

The same is also true in the reverse-biased state for voltages smaller than the characteristic reverse voltage. For voltages lower than the characteristic reverse voltage in the reverse-biased state, the current flowing through the electrical contact is essentially suppressed, for instance, exponentially suppressed. In contrast, when the voltage applied reaches or surpasses the characteristic reverse voltage in the reverse-biased state, the current rises significantly, for instance, exponentially.

Naturally, instead of voltages the same also applies to electric fields taking the geometry and further contact-specific parameters into account. In other words, the IVC may locally be expressed in terms of a current density and an electrical field applied to the electric contact such that the IVC is at least partially determined by a threshold electric field and characteristic reverse electric field similar to the threshold voltage and the characteristic reverse voltage, respectively.

In the case of a Schottky or Schottky-like electrical contact a unipolar charge transport is present across the electrical contact in the forward-biased state. In other words, in the forward-biased state a current transport over the electrical contact is dominated by charge carriers of a single polarity. In the reverse-biased state below the characteristic reverse voltage or characteristic reverse electrical field, the charge transport over the electrical contact is essentially blocked. As a consequence, in the reverse-biased state, below the characteristic reverse voltage or characteristic reverse electrical field, a blocking state is present.

The semiconducting device 100 as shown in FIG. 1 comprises the semiconducting material of the first conductivity type comprising at least locally a second doping concentration different from the first doping concentration along a projection 200 of the mesa 140 into the substrate 110. The projection 200 into the substrate 110 is oriented along the direction 150 from the main surface into the substrate 110. In other words, the projection 200 is essentially perpendicular to the first and second directions along which the substrate 110 has larger dimensions than along the direction 150.

By implementing the higher doping concentration (first doping concentration) in the mesa 140 above the bottom plane 160 than in the substrate outside the mesa and, hence, below the bottom plane 160 along the direction 150, the electrical field inside the mesa can be reduced leading to a more equal field distribution inside the mesa 140. As a consequence, the electrical contact 185 formed at least partially along the sidewalls 190 of the mesa 140 or the recesses 120 can contribute to the current transport more equally. As a consequence, it may be possible to increase the area used for the Schottky or Schottky-like electrical contact 185, which may reduce a voltage drop and, hence, the threshold voltage in the forward-biased state. In other words, optionally, the first doping concentration in the mesa 140 may be higher than the second doping concentration below the bottom plane 160.

The semiconductor material comprising the second doping concentration below the bottom plane 160 may, for instance, be part of the drift area 210 of the semiconductor device 100. For instance, on a back side 220 of the semiconductor device 100, an electrical contact may be arranged such that an electrical transport of charge carriers may flow in or against the direction 150 making the semiconductor device 100 a vertical device.

Optionally, the semiconducting material comprising the second doping concentration may be arranged adjacent to the semiconducting material of the mesa with the first doping concentration. In the case that the mesa 140 comprises an essentially homogeneous doping concentration having the first doping concentration extending down to the bottom plane 140, the semiconducting material having the second doping concentration may, for instance, be arranged directly below the bottom plane. In other words, the semiconducting material comprising the second doping concentration may also be arranged adjacent to the bottom plane 160.

Optionally, the semiconducting device 100 may further comprise a doped region 230-1, 230-2 of the second conductivity type arranged at least partially adjacent to the bottom plane 160 along a projection 240 of the recess 120 such that the mesa 140 is accessible—in both directions—by charge carriers avoiding the doped region 230. Hence, charge carriers may leave and/or enter the mesa 140 without entering or leaving the doped regions 230.

In the cross-sectional view of FIG. 1, underneath both recesses 120-1, 120-2 doped regions 230-1, 230-2, respectively, are arranged. Since the mesa 140 is accessible by charge carriers without getting into contact with the doped regions 230, a region exists between two neighboring doped regions 230 comprising the semiconducting material of the first conductivity type. Due to the doped regions comprising the semiconducting material of the second conductivity type, under some operational conditions, a depletion zone may form at the interface of the doped region 230 and the semiconducting material of a first conductivity type along the projection 200 of the mesa 140. Therefore, it may be possible to pinch off the mesa 140 in the reverse-biased state such that due to a lack of charge carriers in the depletion zone, such that a major part of the voltage drops across the depletion zone.

Naturally, in embodiments, the doped region 230 may extend into the projection 200 of the mesa 140 into the substrate 110. As a consequence, the depletion zone may form, for instance, in the reverse-biased state pinching off the mesa 140 more efficiently.

Optionally, as indicated by dashed lines in FIG. 1, the semiconducting device 100 may comprise a further doped region 250 of the first conductivity type arranged along the projection 200 of the mesa 140 into the substrate 110 and in a direction perpendicular to the projection 200 adjacent to the doped regions 230. Optionally, the further doped region 250 may comprise a third doping concentration being larger than the first doping concentration of the mesa 140 and the second doping concentration along the projection 200 of the mesa 140. This may allow a more even distribution of the current entering or leaving the mesa 140 in the forward-biased operation and, hence, may enable a more even distribution of the currents inside the mesa.

The electrically-conductive structure 180 arranged at least partially along the sidewalls 190 of the recess 120 may be formed or comprise material or a group of materials. The group of materials comprises, for instance, metals like aluminum (Al), titanium (Ti), zinc (Zn), tungsten (W), tantalum, (Ta), molybdenum (Mo), copper (Cu), nickel (Ni), gold (Au), hafnium (Hf), molybdenum nitride (MoN), tantalum nitride ($Ta_xN_y$), titanium nitride (TiN) and platinum (Pt). However, the group of materials also comprises alloys as well as doped poly-silicon (poly-Si), undoped poly-silicon, doped poly-germanium (poly-Ge), undoped poly-germanium, narrowband semiconducting materials, wideband semiconducting materials, II-VI semiconducting materials and III-V semiconducting materials.

In the case of the classical metals, the electrical contact 185 formed between the electrically-conductive structure 180 and the semiconducting material inside the mesa 140 is typically a Schottky contact. However, in the case of the semiconducting materials mentioned above, the electrical contact behaves similar to a Schottky electrical contact, but is not a Schottky contact 185 in the classical sense. Therefore, an electrical contact 185, formed between such a material of the electrically conductive structure 180 and the semiconducting material 140 is referred to as a Schottky-like electrical contact 185. Also in this case, the electrical contact is typically a unipolar electrical contact in the forward-biased state as outlined before. In the reverse-biased state, typically a blocking state exists as outlined before.

In the embodiment shown in FIG. 1, the electrically-conductive structure 180 essentially fills the whole recess 120 and, hence, forms the Schottky or Schottky-like electrical contact on the whole sidewalls 190 of the recess 120 or the mesa 140. The electrically-conductive structure 180 is further arranged on top of a top surface 260 of the mesa 140 forming an upper part of the Schottky or Schottky-like electrical contact with a semiconducting material of the mesa 140. The electrically-conductive structure arranged on the sidewall 190 of the mesa 140 forms a lower part of the Schottky or Schottky-like electrical contact. As a consequence, it may be possible to further reduce the threshold voltage in the forward-biased state by enlarging the area covered by the electrically-conductive structure 180.

However, optionally, the Schottky or Schottky-like electrical contact 185 may be configured such that the upper part of the Schottky or Schottky-like electrical contact comprises a lower (forward) threshold voltage than the lower part of the Schottky or Schottky-like electrical contact. This may, for instance, be achieved by implementing different materials for the different parts of the electrically-conductive structure 180. For instance, the electrically-conductive structure 180 may comprise a top region 270 arranged on the top surface 260 of the mesa 140 and comprising material which may have a lower Schottky barrier than a material used for the lower part of the electrically-conductive structure along the sidewalls 190. By arranging a material with a lower Schottky barrier in the top region 270, it may be possible to reduce the threshold voltage in the forward-biased state more efficiently. By placing the material essentially only on the top surface 260 and using a material with a higher Schottky barrier at the sidewalls 190, may allow lower leakage currents in the reverse-biased state by placing the material with a potentially higher leakage current tendency further away from the doped regions 230 causing the pinching-off in the reverse-biased state.

However, optionally, to reduce the threshold voltage in the forward-biased state further, it may be possible to implement the mesa 140 comprising a height along the direction 150 into the substrate being larger than a width perpendicular to the direction 150. In other words, the mesa 140 may comprise a height along the direction 150 into the substrate 110 and a width perpendicular to the direction 150 into the substrate 110 such that the height is at least equal to the width. As a consequence, an area of the Schottky or Schottky-like electrical contact 185 between the electrically-conductive structure 180 and the semiconducting material of the mesa 140 may become larger, which may lead to a reduced threshold voltage. However, by increasing the distance to the bottom plane 160 and, hence, to the optionally-implemented doped regions 230, the risk of exceeding the characteristic reverse voltage of the material used for the top region 270, when implemented, may be also reduced, which may lead to an unacceptably high leakage current.

In other embodiments, the height may be at least two times, at least five times, at least ten times, at least twenty times or at least fifty times larger than the width of the mesa 140. By increasing the height compared to the width, the previously-mentioned effects may eventually be amplified. However, fabrication may also become more difficult leading to a higher discard and, hence, to higher over-all costs for the semiconductor device 100.

Optionally, the semiconductor device 100 may, hence, be configured to cause a depletion of charge carriers in the area along the projection 200 of the mesa 140 into the substrate 110 such that, when a pinched-off voltage in the range of 5 V to 50 V is applied to the electrically-conductive structure 180 and a counter electrode 280 such that the Schottky or Schottky-like electrical contact 185 is in the reverse-biased state, a characteristic reverse electric field strength at the surface of the Schottky or Schottky-like electrical contact 185 is not exceeded, which is also referred to as a critical surface field strength, which is under normal operating conditions not to be exceeded.

Figure 2:
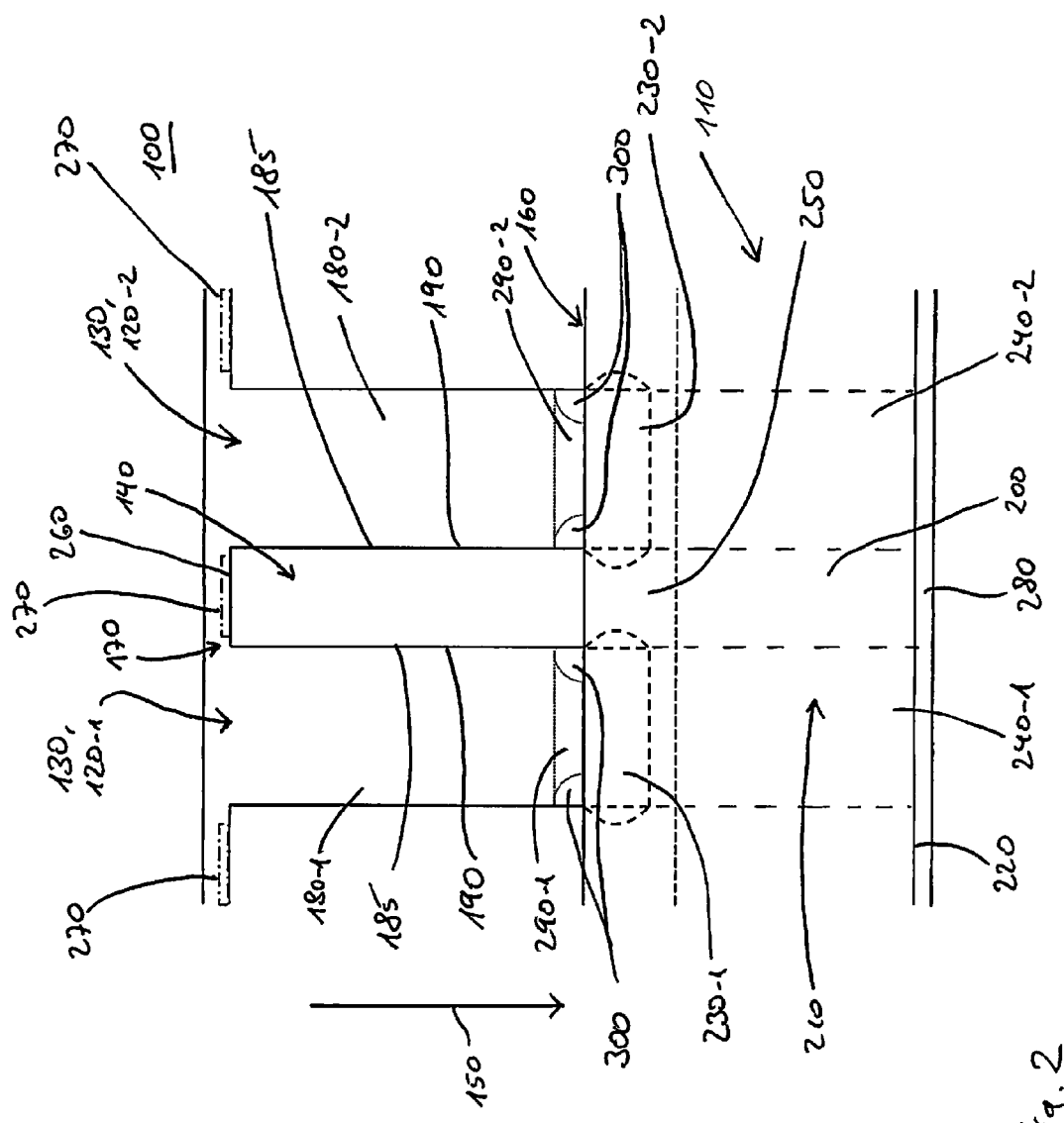
FIG. 2 shows a cross-sectional view of a semiconductor device according to a further embodiment.

FIG. 2 shows a cross-sectional view of a semiconductor device 100 according to a further embodiment. The semiconductor device 100 of FIG. 2 differs from the one shown in FIG. 1 by a few optional modifications. For instance, the further doped region 250 extends in the semiconductor device 100 shown in FIG. 2 further into the substrate 110 than the doped regions 230 and below the doped regions 230. When, for instance, the further doped region 250 comprising a doping concentration (third doping concentration) being larger than both the first doping concentration of the mesa 140 and the second doping concentration along the projection 200 into the substrate 110, the further doped region 250 may be able to distribute the current flowing between the electrically-conductive structure 180 and the counter electrode 280. Due to the higher doping concentration of the further doped region 250, an additional voltage drop caused by the redistribution or spreading of the current may be reduced compared to an implementation with a lower doping concentration in the further doped region 250. In the case the further doped region 250 extends further into the substrate 110 than the doped regions 230 and below the doped regions 230, the further doped region 250 is also sometimes referred to as a current spread region.

In other words, by implementing the further doped region 250 to extend below the doped region 230 and extending further into the substrate 110 than the doped region 230, the currents in the drift area 210, which also referred to as drift zone, may be distributed more evenly.

Depending on the materials used for the electrical conductive structure 180 forming, for instance, the Schottky or Schottky-like electrical contact 185 along the sidewalls 190, implementing an electrical contact structure 290 may be an advisable option to improve an electrical contact of the doped region 230 arranged below and, therefore, along the projection 240 into the substrate 110 of the recess 120. The recess 120 may in this case comprise the electrical contact structure 290 arranged on the bottom plane 160 of the recess 120. The electrical contact structure is configured to electrically couple the doped region 230 through the electrically-conductive structure 180.

The electrical contact structure 190 may, for instance, comprise a material of a group of contact materials. The group of contact materials may, for instance, comprise metals such as aluminum (Al), titanium (Ti), copper (Cu), or nickel (Ni), alloys but also (highly) doped poly-silicon (poly-Si), poly germanium (Ge) or the like.

In the case an electric contact structure 290 is implemented, the electrically-conductive structure 180 forming the Schottky or Schottky-like electrical contact 185 may not extend along the full sidewall 190 of the mesa 140 or the recess 120. In other words, the semiconductor device 100 shown in FIG. 2 differs also from the semiconductor device 100 of FIG. 1 by the electrically-conductive structure 180 only partially extending along the sidewall 190 of the recess 120 or the mesa 140. However, it should be noted that implementing an electrical contact structure 290 is by far not necessary to restrict the extension of the Schottky or Schottky-like electrical contact 185 along the sidewall 190.

Independent of the question as to whether the electrical contact structure 290 is implemented, an electrically-insulating structure 300 may be arranged partially along the sidewall 190 of the recess 120 at the bottom plane 160. By implementing the electrically-insulating structure 300 it may be possible to limit the extension of the Schottky or Schottky-like electrical contact along the sidewall 190 and, independent of this aspect, to reduce electrical field strengths at the corners of the recess 120 at the bottom plane 160. By implementing the electrically-insulating structure 300, it may therefore be possible to configure the semiconductor device 100 to sustain higher voltages in the reverse-biased state of the Schottky or Schottky-like electrical contact 185.

The electrically-insulating structure 300 may comprise in principle any insulating material such as silicon dioxide, aluminum oxide, but also organic materials if applicable.

Due to the different approaches and optional features implemented in a semiconductor device 100 according to an embodiment, the semiconductor device 100 may be configured such that in the reverse-biased state of the Schottky or Schottky-like electrical contact 185, an electric field strength along the sidewall 190 of the mesa 140 may be kept essentially constant along a portion of the sidewall comprising at least 50% of a height along the direction 150 into the substrate 110 of the sidewall 190. Naturally, in other embodiments, increasing the previously-mentioned ratio of 50% may be possible. For instance, it may be possible for the portion to comprise at least 75%, at least 90% or even at least 95% of the height of the sidewall 190. However, under some operation conditions or in other embodiments, the portion may be smaller than the previously-mentioned 50%.

Optionally, the device may be designed such that the electric field at the sidewall 190 at a normal operating voltage is at most 30% of a maximum electric field below the bottom plane 160 and, hence, in the bulk of the device 100.

Although in FIGS. 1 and 2 two recesses 120-1, 120-2 have been shown forming the mesa 140, the number of recesses 120 is by far not limited to two. In other embodiments, also a single recess 120 forming the mesa 140 may be implemented. However, in further embodiments, more than one mesa 140 may be implemented as well based on one or more recesses 120.

A semiconductor device 100 according to an embodiment may be a discrete device or be part of a larger discrete device or an integrated circuit. Examples come from different fields of circuit elements as well as integrated circuits. As outlined before, a semiconductor device 100 according to an embodiment may be implemented as a stand-alone discrete device but may also be integrated within an active switch or the like, for instance on the basis of a silicon carbide substrate and semiconducting material.

For instance, in the case of a stand-alone or discrete Schottky diode implemented as a semiconductor device 100 according to an embodiment, it may be possible to increase the area of the Schottky or Schottky-like electric contact 185. In the case of implementing a semiconductor device 100 according to an embodiment in the framework of another device comprising an active switch or the like, it may be possible to improve the forward characteristics of, for instance, the body diode performance leading to lower costs and, optionally, to a lower area consumption compared to more conventional existing solutions. The body diode performance may, for instance, be improved by decreasing the forward voltage drop (threshold voltage) and/or a faster switching speed.

A semiconductor device 100 according to an embodiment may offer the possibility of significantly increasing the area of the Schottky or Schottky-like electrical contact 185. By this, it may be possible to achieve a reduction of the effective threshold voltage in the forward-biased state. The increase of the area may be implemented, as described above, by narrow trench structures (trench 130, recess 120), which may be completely filled with the respective contact material, such as a Schottky contact metal. The bottoms or floors of the trenches 130 may be adjacent to p+-regions (doped region 230) which may shield electrical fields in the reverse-biased state comparable to a MPS-structure (merged PIN Schottky diode). As a consequence, it may be possible to have comparably small electrical fields at the sidewalls 190 forming the Schottky interfaces between the electrically-conductive structure 180 and the semiconducting material of the mesa 140.

It may be possible to implement the doped regions 230 and the lower doped n-doped region between the doped regions 230 such that they form a JFET-like structure (Junction Field Effect Transistor) having a pinched-off voltage of approximately 5 V to 10 V, which is typically smaller than the pinched-off voltage in the mesa 140. As a consequence, it may be possible to limit the voltages present at the Schottky or Schottky-like electrical contact to this value and to limit the leakage current in the reverse-biased state accordingly.

By increasing the area of the Schottky or Schottky-like electric contact by a factor of 10 compared to a planar implementation, the threshold voltage may eventually be reduced by approximately 0.1 V. Increasing the area further, may lead to a further reduction.

However, to take full advantage of the specific area of the Schottky or Schottky-like contact, it may be advisable to increase the doping concentration of a semiconducting material in the mesa 140 by approximately one or two orders of magnitude to reduce a resistance inside the mesa 140 for the charge carriers. The higher the doping concentration, the more evenly distributed is the current density along the sidewalls 190 of the mesa 140. Additionally, the higher doping of the mesa 140 may also lead to a further reduction of the threshold voltage by approximately 0.1 V.

Due to the comparably small threshold voltages in the forward-biased state and the characteristic reverse voltages in the reverse-biased state and the resulting comparably small leakage currents, it may be possible to use a Schottky metallization or another Schottky-like material with a small barrier height such as titanium (Ti). However, as outlined before, alternatively or additionally, also p+- or n+-poly silicon (poly Si) may be used. As a consequence, it may be possible to reduce the threshold voltage by approximately 0.5 V compared to more conventional solutions.

By implementing a semiconductor device 100 according to an embodiment, it may be possible to increase the area of the Schottky or Schottky-like electrical contact without significantly changing the device's footprint and the leakage current.

Figure 3:
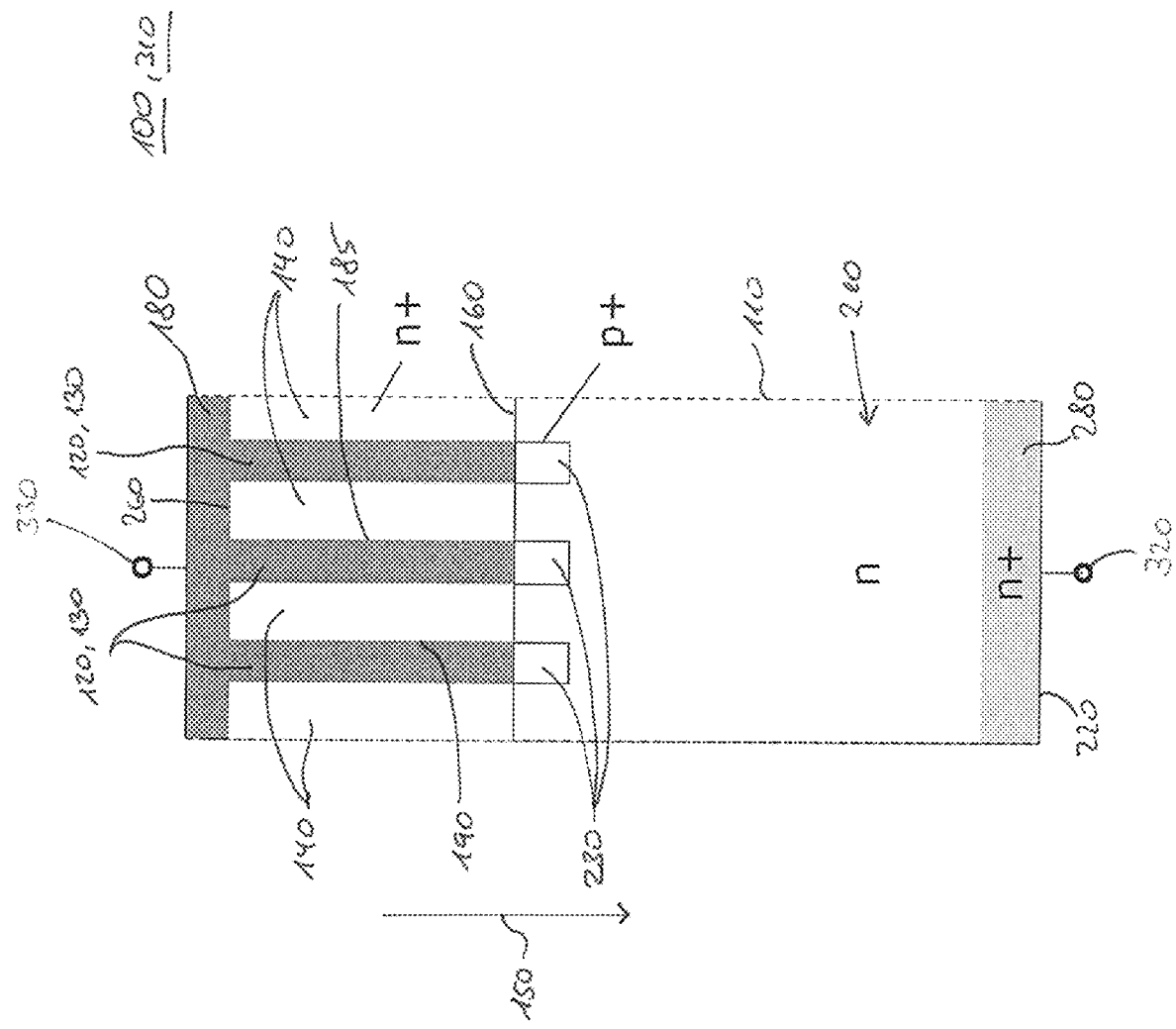
FIG. 3 shows a semiconductor device in the form of a SiC-Schottky diode according to an embodiment.

In the following, with reference to FIGS. 3, 4 and 5, a silicon carbide trench Schottky diode will be described in more detail as an embodiment of a semiconductor device 100. FIG. 3 shows a cross-sectional view of a semiconductor device 100 in the form of a silicon carbide Schottky diode 310. The silicon carbide Schottky diode 310 comprises a plurality of trenches 130 forming the recesses 120 having the previously-described bottom plane 160. The recesses 120 are filled with a Schottky metal to form the electrically-conductive structure 180 forming in turn the Schottky electrical contacts 185 along the sidewalls 190 and at the top surface 260 of the mesas 140. However, it should be noted that once again instead of the Schottky metal to fill the recesses 120, p-doped poly-silicon may also be used as well as other materials. Additionally, on top of the mesa 140 at its top surface 260 a Schottky metal or another p-doped poly-silicon may be used. In the case of poly-silicon being used to form at least partially the electrically-conductive structure 180, the electrically-conductive structure 180 forms at least partially a Schottky-like electrical contact 185 with a semiconducting material of the mesa 140. The semiconducting material in the mesa a highly n-doped silicon carbide (n+) filling the mesa 140 down to the bottom plane 160. Below the bottom plane 160 along the direction 150, the substrate 110 comprises in the drift area 210 an n-doped silicon carbide semiconducting material (n) and at the back side 220 a counter electrode 280 formed by a highly n-doped silicon carbide semiconducting material (n+). The counter electrode 280 is coupled to a terminal 320 forming the anode of the Schottky diode 310. Correspondingly, a terminal 330 is electrically coupled to the electrically-conductive structure 180, the terminal 330 and the electrically-conductive structure 180 forming the cathode of the Schottky diode.

Below the recesses 120 doped regions 230 are implemented along the direction 150 into the substrate 110. In other words, the doped regions 230 are arranged along a projection 200 of the recesses 120 into the substrate 110. The doped regions 230 comprise highly p-doped silicon carbide semiconducting material (p+).

FIG. 3 shows, therefore, a trench-Schottky diode 310 with a large contact area between the electrically-conductive structure 180 and the semiconducting material of the mesas 140 forming the Schottky or Schottky-like electrical contacts. Such a device may, for instance, be fabricated using the following process operations. In an early process operation, via a resist mask used for a junction termination extensions (JTE), the doped regions 230 may be implanted and depositing an epitactical layer of the semiconducting material afterwards.

However, the doped regions 230 may also be fabricated in a self-aligned way by doping the semiconducting material at a later state in the process.

Afterwards, a hard mask for etching the trenches can be deposited and optionally, solidified and patterned by lithographic operations and dry etching processes. The lithographic operations may comprise deep-UV lithography (UV=Ultra Violet). Afterwards, the trenches can be etched. A high temperature tempering process to round edges at the bottom of the trenches 130 may follow. After lifting off the hard mask, the trenches may be filled, for instance, with poly-silicon or nickel-aluminum (NiAl) following a planarization operation. The poly-silicon can also be used on the top surface 260 of the mesa 140 as an electrical contact. In this case, it may be advisable not to etch back down to the top surface 260 of the silicon carbide mesa 140. Optional temper processes may also be used here.

Afterwards, the front side and the back side 220 may be processed, for instance, including depositing a protective layer (e.g. an imide), applying a front side metallization (FSM) and a back side metallization (BSM).

However, the doped regions 230 may also be formed in a self-aligned way. Before lifting of the hard mask for etching the trenches 130, a p-implantation of the bottom of the trenches 130 (recesses 120) may be done using the hard mask.

To protect the mesa 140 and as an additional protection for the sidewalls 190, a thermal oxidation may be carried out. Depending on the semiconductor material used, an orientation of the crystalline structure may exhibit substantially different oxidation rates. As a consequence, a thicker oxide may stop the ions of the implantation from penetrating the sidewalls 190 since their angle of incidence with respect to the surface of the sidewalls 190 is very shallow. However, at the bottom of the trenches 130, where the angle of incidence is approximately 90°, the ions can penetrate a thinner oxide layer and create the desired p-implantation. After the implantation, the thermal oxide can be lifted off along with the hard mask. In the case of a thermal oxidation, the oxide may grow on the sidewalls 190 up to several times (e.g. five times) faster than on the bottom of the trench 130, supporting the process described above.

Optionally, the trenches 130 or recesses 120 may be formed such that sidewalls 190 are parallel to a (112;⁻0)-plane (=11-20) or a (11;⁻ 00)-plane (=1-100). The main surface of the die at it top side may, for instance, be parallel to the (0001)-plane, while its backside may be parallel to the (0001;⁻)-plane (=000-1). This may be fabricated by aligning the trenches 130 such that their sidewalls first are approximately parallel to the desired plane. Then, by tempering the sample in a hydrogen ($H_2$) atmosphere, the precise planes will form.

The Schottky diode 310 shown in FIG. 3 is based on the idea of separating electrically and spatially the Schottky diode and the drift area 210. This is achieved by enlarging the contact area of the Schottky or Schottky-like electrical contact per unit chip area by a factor of one or two orders of magnitude (factor of approximately 10 to approximately 100) which may lead to a reduction of a threshold voltage of approximately 0.1 to 0.2 V. Moreover, the doping concentration of the semiconductor material in the mesa 140 is increased by one or two orders of magnitude compared to a doping concentration in the drift area 210, which may, for instance, comprise the second doping concentration as laid out before. This may also lead to a reduction of the threshold voltage by approximately 0.1 to 0.2 V.

By clearing the mesa 140 at comparably small voltages beginning in the range of approximately 5 to 10 V, the electrical field strength at the Schottky or Schottky-like electrical contact may be kept small. Accordingly, the leakage current may also be kept small. Technically, this is done by the doped regions 230 (p+-regions), which clear or deplete the semiconducting material at the bottom level 160 of the mesas 140 (n-regions) at smaller voltages. As a consequence, the Schottky or Schottky-like electrical contacts may be shielded.

As a consequence, it may be possible to use a material for the electrically-conductive structure 180 such as a Schottky metallization having a smaller work function like, for instance, titanium (Ti) or hafnium (Hf). As outlined before, an n+-doped poly-silicon or an n-doped silicon carbide material for the electrically-conductive structure 180 may also be used.

Optionally, fabricating the nickel-aluminum contacts may be done prior to depositing the poly-silicon, when the poly-silicon is used as a Schottky-like electrical contact on the front side of the die. The nickel-aluminum-regions may then be electrically contacted by the poly-silicon.

Similar to the processes described above, it may also be possible to deposit on top of the trenches 130 for instance an n-doped poly-silicon with a lower barrier or another material such as molybdenum (Mo) or hafnium (Hf) having a Schottky barrier with respect to silicon carbide (SiC) of not more than 1.1 eV. When on the top surface 260 of the mesas 140 a different material than poly-silicon is used as a Schottky-like material, additionally the barrier of the semiconducting material at the top surface 260 of the mesa 140 may be reduced by a shallow n-implantation. Alternatively, a Schottky material such as hafnium (Hf), molybdenum nitride (MoN) or titanium nitride (TiN) or another material with a lower work function with respect to a silicon carbide may be used.

Moreover, it may be possible to configure the width of the mesa 140 and its doping concentration (e.g. the first doping concentration) such that the mesa 140 is depleted at a reverse voltage of approximately 10 V. In this case, the upper part of the electrically-conductive structure forming a Schottky or Schottky-like electrical contact is then only required to have a characteristic reverse voltage of approximately 10 V. Naturally, instead of 10 V, which merely represents one example, the mesa 140 and the material(s) used for the electrically-conductive structure 180 may be configured in such a way that any other technically-feasible voltage level as described above in terms of the example of 10 V may be used.

Moreover, before the above-mentioned process operations for fabricating a Schottky diode 310, a silicon carbide layer may be epitactically grown, which comprises a higher doping concentration than the drift area 210. This layer is under ideal circumstances approximately as thick as the trenches 130 or the recesses 120 formed in the following process operations. As a consequence, the drift area 210 may start at the bottom level 160 of the recesses 120 or trenches 130. In combination with a p-implantation at the bottoms of the trenches 130 or recesses 120 it may be possible to deplete the mesas 140 at very low voltages to enable the Schottky or Schottky-like contacts to be shielded off at higher electrical field strength.

Moreover, lower parts of the sidewalls of the mesas 140 or of the recesses 120 may be p-implanted to accelerate the forming of the depletion region or space-charge region in the trenches 130 or the recesses 120.

Moreover, the mesas 140 may be formed having a conical cross-section, for instance, being narrower at the bottom level 160 than at the top surface 260. In this case, the doping concentration inside the mesa 140 may be configured such that the mesa may be homogeneously depleted. This may be achieved by adjusting the doping concentration levels inside the mesa 140 in such a way that the doping concentration is lower where the mesa 140 is wider.

Using an appropriate line of process of fabricating the hard mask for etching the trenches 130 and the following etching of the trenches, an angle of the sidewalls 190 larger than 90° at the bottom level 160 may be realized. In other words, the mesas 140 may be formed conically reducing their widths above the bottom level towards the top surface 260. By using an n-implantation of the mesas 140 or by adapting the doping concentration of the silicon carbide layer as a function of its thickness as outlined above, the doping level may be adapted of the mesas 140 accordingly. As a consequence, it may be possible to pinch off the mesas 140 along their full height at the same time.

The doping of the mesas 140 may also be carried out by a sidewall implantation instead of using epitactical growth. For instance, by implanting the semiconductor material of the mesas 140 at an angle being different from 0° with respect to the direction 150, the sidewalls 190 of the mesas 140 may be implanted or doped. Due to the presence of mesas 140 in the vicinity, a shadowing of neighboring mesas may occur. As a consequence, a part of the mesa 140 at the bottom level may eventually not be implanted or doped. As a consequence, it may be possible to implement different barrier heights for the Schottky or Schottky-like electrical contacts along the height of the mesa 140 using, for instance, an n-implantation. By using several implantation operations at different angles, a number of regions with different barrier heights may be realized. Using N implantation processes, may, therefore, lead to (N+1) different regions. It may therefore be possible, to control the pinching-off of the mesas 140 more closely, when, for instance, not only the dose and the angle of the implantation, but also the energy used is varied, for instance in the framework of a p-implantation.

As outlined before, the barrier at the top surface 260 of the mesa 140 may be reduced by doping or implantation. Here, the same material for the Schottky barrier may be used on the top surface 260 and along the sidewalls 190 in the recess 120 or the trench 130.

Further process variations comprise, for instance, the previously-mentioned thermal oxidation of the sidewalls 190, which may be used to create a thicker oxide to protect the sidewalls 190 during the trench bottom implantation, as outlined above.

In other words, FIG. 3 shows a schematic representation of a three-dimensional Schottky diode, which offers the possibility of increasing the area of the Schottky or Schottky-like electrical contact independent of a width of the Schottky region. This may allow decreasing the costs and the form factor of these devices. Moreover, it may be possible to increase the shielding of the Schottky diode in a blocking mode of operation. Using an embodiment may therefore allow a monolithic integration of a three-dimensional silicon carbide Schottky diode 310 within a silicon carbide active switch or a similar structure. The third dimension or —in other words—the sidewalls 190 may be used to increase the area for the Schottky or Schottky-like electrical contact.

Figure 4:
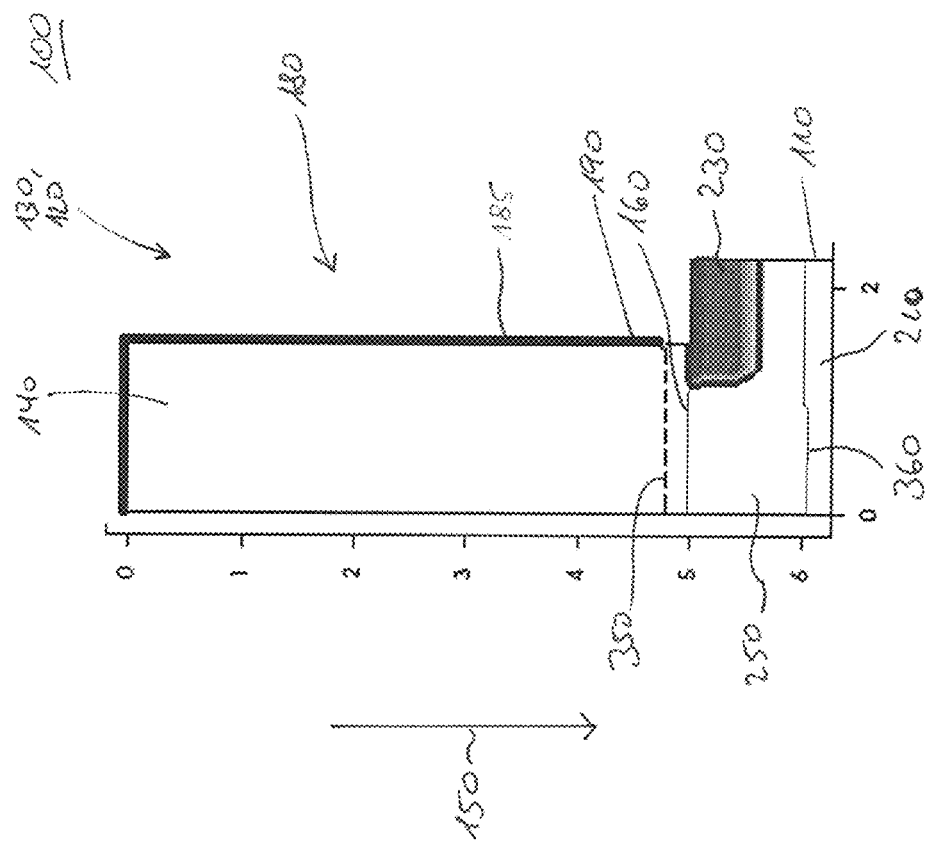
FIG. 4 shows a cross-sectional view of a semiconductor device according to an embodiment.

FIG. 4 shows a cross-sectional view of a basis for a simulation of the electrical behavior of a semiconductor device 100 according to an embodiment. To be more precise, FIG. 4 shows a recess 120 in the form of a trench 130 and a mesa 140. The recess 120 comprises an electrically-conductive structure 180, which forms a Schottky or Schottky-like electrical contact 185 with the semiconducting material comprised in the mesa 140. The Schottky or Schottky-like electrical contact 185 does not extend all the way down to the bottom level 160 of the recess 120. The recess 120 may, for instance, comprise at a level 350 indicated by a dashed line in FIG. 4 an electrically-insulating structure 300 at the sidewall 190 of the mesa 140 or the recess 120, which is, however, not shown in FIG. 4.

The bottom level 160 further indicates a boundary of a layer of the semiconducting material used for the mesa 140. Inside the mesa 140 the semiconducting material (e.g. silicon carbide, SiC) comprises the first doping concentration. Beginning at the bottom plane 160 and extending further into the substrate 110 along the direction 150, a further doped region 250 is implemented having a third doping concentration being higher than the first doping concentration in the mesa 140. The further doped region 250 extends further into the substrate 110 along the direction 150 than a doped region 230 having the opposite conductivity type than the semiconducting material in the mesa 140, the further doped region 250 and a drift area 210 following the further doped region 250 beginning at a level 360. The doping concentration of the further doped region 250 (third doping concentration) is also higher than a doping concentration of the semiconducting material of the drift area 210 (second doping concentration). As a consequence, the further doped region 250 acts once again as a current spread structure enabling a more evenly distributed current flow in the lower doped drift area 210. This may reduce a voltage drop across the drift area 210 in the forward-biased state of operation of the semiconductor device 100.

The doped region 230 having the opposite conductivity type than the semiconducting material of the mesa 140, the further doped region 250 and the drift area 210 extends into a projection of the mesa 140 below the bottom plane 160. As a consequence, it may be possible to pinch off the mesa 140 in the reverse-biased state more easily.

Figure 5:
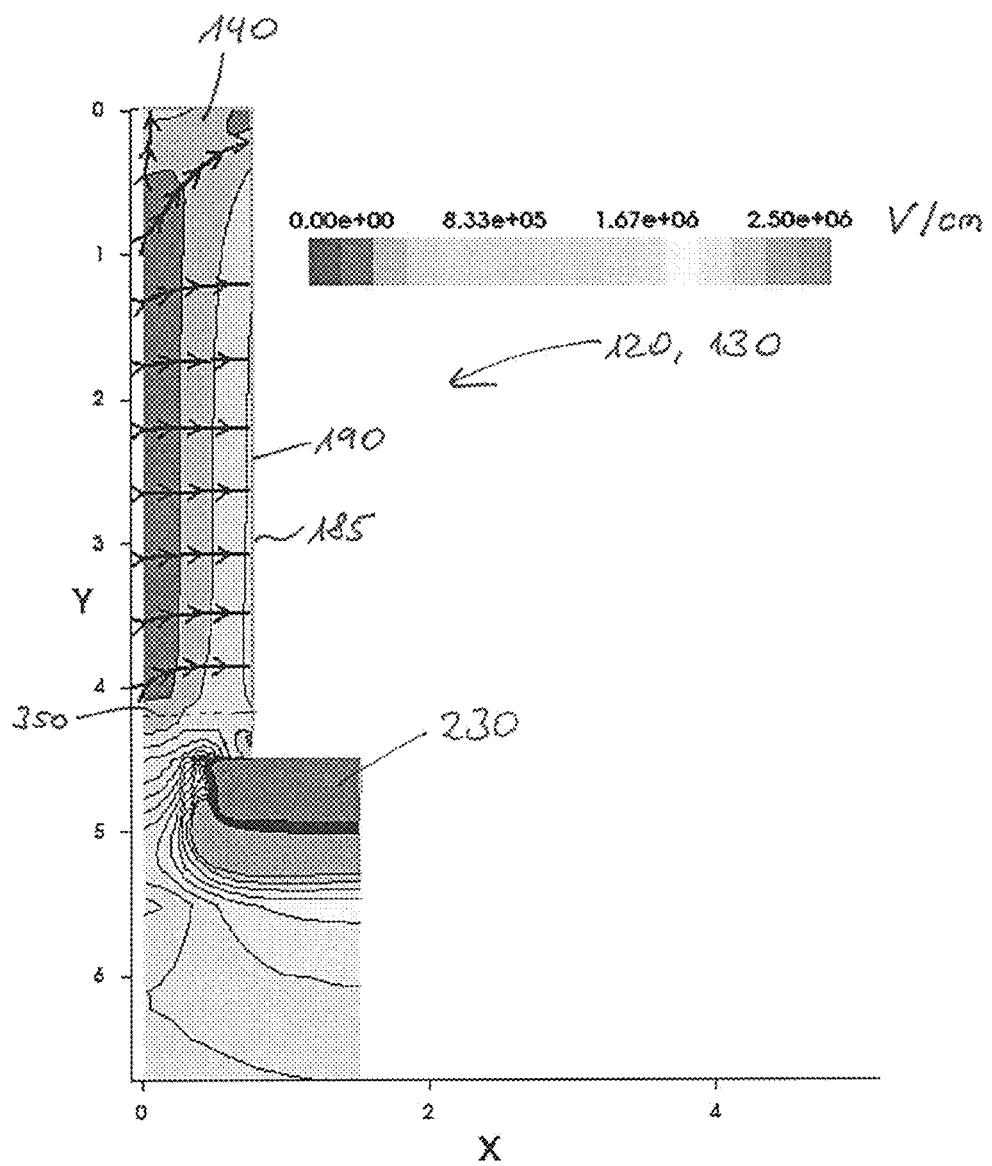
FIG. 5 shows an electrical field distribution of the semiconductor device shown in FIG. 4.

FIG. 5 shows a result of a numerical simulation with respect to the absolute values of the electrical fields inside the mesa 140 and the further components of the semiconductor device 100 shown in FIG. 4 at a voltage of 650 V applied in the reverse-biased state. FIG. 5 illustrates that in the reverse-biased state the electrical fields along the sidewalls 190 of the recess 120 or the trench 130 are essentially constant. It may therefore be possible to use a material with a lower Schottky or Schottky-like barrier along the sidewalls 190 of the recess 120.

In the following further examples of an implementation of a Schottky or Schottky-like electrical contact for a junction field effect transistor (JFET) and a vertical field effect transistor (MOSFET=Metal-Oxide-Semiconductor Field Effect Transistor) will be shown. These implementations as well as the Schottky diode 310 shown above may be implemented based on silicon carbide (SiC), but may also be implemented based on different semiconducting materials and substrates.

Figure 6:
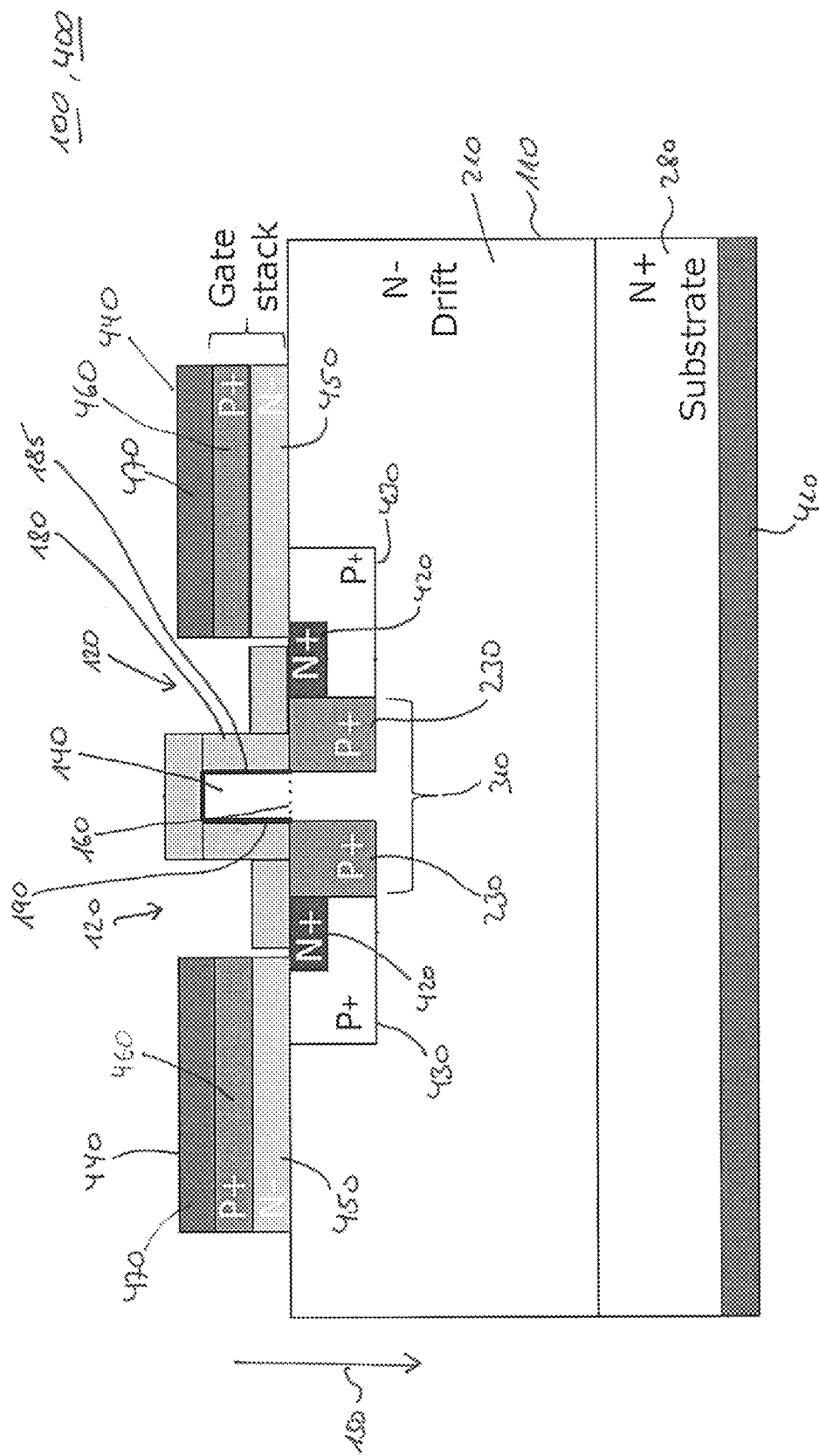
FIG. 6 shows a cross-sectional view of a junction field effect transistor (JFET) according to an embodiment.

FIG. 6 shows a cross-sectional view of a further semiconductor device 100 according to an embodiment in the form of a junction field effect transistor 400 (JFET) arranged at least partially on a substrate 110. The JFET 400 comprises a recess 120, which may, for instance, be fabricated as a trench. The recess 120 forms a mesa 140 extending along a direction 150 into the substrate 110 to a bottom plane 160 of the recess 120. The mesa 140 comprises a semiconducting material of a first conductivity type, for instance an n-doped semiconducting material. The semiconducting material may be in principle any semiconducting material, although in the following the description will be focused on silicon carbide (SiC). This, however, only represents one example for a possible semiconductor material.

The JFET 400 further comprises an electrically-conductive structure 180 arranged at least partially along a sidewall 190 of the mesa 140. The electrically-conductive structure 180 forms a Schottky or Schottky-like electrical contact 185 with the semiconducting material of the mesa 140 as outlined before.

The JFET further comprises a doped region 230 of a second conductivity type arranged at least partially adjacent to the bottom plane 160 of the recess 120 along a projection into the substrate 110 following the direction 150 such that the mesa 140 is accessible by charge carriers avoiding the doped region 230. In the embodiment shown in FIG. 6, the doped region 230 is formed by a highly p-doped silicon carbide semiconducting material (p+). The doped region 230 in the example shown here does not extend into a projection of the mesa 140 into the substrate 110 along the direction 150. This, however, may be the case in other embodiments.

The JFET further comprises a drain contact 410 formed as a metal contact on a counter electrode 280 formed by a highly n-doped semiconducting material which may be optionally provided as part of the substrate. On top of the counter electrode 280, a drift area 210 may be implemented, which may be part of the substrate 110 or may be an epitactical layer grown on the substrate.

The drift area 210 comprises the semiconducting material of the first conductivity type. In the embodiment shown in FIG. 6, the drift area 210 is a lowly n-doped semiconducting material (n−). The drift area 210 is arranged along the direction 150 into the substrate 110 between the drain contact 410 and the electrically-conductive structure 180.

The JFET 100 further comprises a source region 420 coupled to the electrically-conductive structure 180 and comprising the semiconducting material of the first conductivity type. Here, it is a highly n-doped semiconducting material. The source region 420 is shut off from the drift area 210 by a semiconductor region 430 of a second conductivity type, which is at least partially formed by the doped region 230. The semiconducting region 430 is also referred to as the body of the JFET 400.

In the embodiment shown in FIG. 6, the semiconducting region 430 shutting off the source region 420 from the drift area 210 is formed by highly p-doped semiconducting material (p+), which may be identical with the doped region 230 or comprise the doped region 230. Naturally, the semiconducting region 430 may also comprise different doping levels. In this case, the doped region 230 may eventually comprise a different doping concentration.

The JFET 400 further comprises a gate stack arrangement 440 comprising a first layer of the first conductivity type, a second layer 460 of the second conductivity type and a gate contact 470. The second layer 460, which is implemented here as a highly p-doped layer, while the first layer 450 is implemented as a lowly n-doped layer (n−), is arranged between the first layer 450 and the gate contact 470. However, in other embodiments the doping concentration and the thickness may be chosen such that the desired pinch-off voltage is implemented. The first layer 450 is in electrical contact with the source region 420 and the source region 430 of the second conductivity type.

The mesa 140 along with the electrically-conductive structure 180 forms a Schottky diode or Schottky-like diode 310 which may optionally comprise the doping concentrations as outlined above in the context of FIGS. 1 to 5.

In operation, a channel may form in the first layer 450 of the gate stack arrangement 440, which is controllable by a voltage applied to the gate contact 470. Depending on the control voltage applied to the gate contact 470, the channel forming in the first layer 450 may be controlled by creating a depletion zone at the pn-junction between the first and second layers 450, 460. The channel may even be fully pinched off when applying an appropriate voltage to the gate contact 470.

In other words, a three-dimensional Schottky or Schottky-like contact 184 may be integrated within a body diode contact of a semiconductor device 100 in the form of a JFET 400 as shown in FIG. 6. It is to be noted that FIG. 6 shows a more schematic view of a JFET 400 according to an embodiment. When implementing the device based on silicon carbide, the JFET 400 is also referred to as a SiC JFET. The electrically-conductive structure 180 may form the electrical contact for the source region 430 and the body diode formed here as a Schottky diode 310. It may, as outlined before, be formed by a metal contact, but may also comprise other materials mentioned above. In yet other words, FIG. 6 shows a schematic representation of a silicon carbide JFET with a monolithic integration of a three-dimensional silicon carbide Schottky diode 310.

Figure 7:
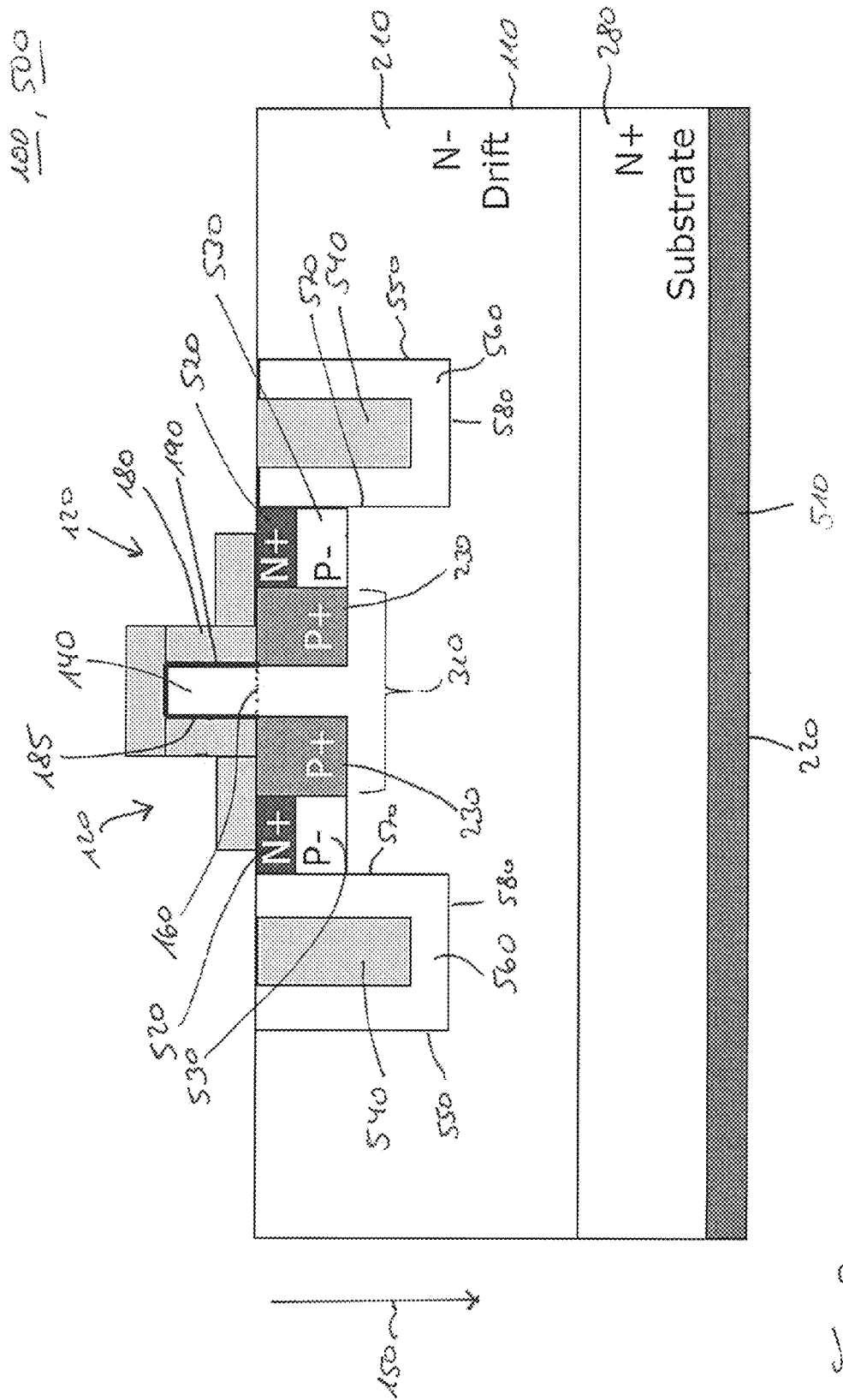
FIG. 7 shows a cross-sectional view of a vertical field effect transistor (FET) according to an embodiment.

FIG. 7 shows a schematic cross-sectional view of a SiC trench MOSFET with a monolithic integration of a three-dimensional silicon carbide Schottky diode 310. To put it in different terms, FIG. 7 shows another semiconductor device 100 according to an embodiment in the form of a vertical field effect transistor (FET) 500. The FET comprises once again a recess 120 forming a mesa 140 which extends along a direction 150 into the substrate 110 to a bottom plane 160 of the recess 120. The mesa 140 comprises once again a semiconducting material of a first conductivity type.

The recess 120 may once again be optionally formed by a trench but may also be formed by growing an epitactical layer on a surface of a substrate 110 and creating the recess 120 forming the mesa 140. In the embodiment depicted in FIG. 7 the second approach has been used.

The FET 500 according to an embodiment further comprises an electrically-conductive structure 180 arranged at least partially along a sidewall 190 of the mesa 140 as outlined before. The electrically-conductive structure 180 forms a Schottky or Schottky-like electrical contact 185 with the semiconducting material of the mesa 140. Once again, the semiconductor device 100 in the form a FET 500 comprises a doped region 230 of a second conductivity type (highly p-doped semiconducting material in the embodiment shown in FIG. 7) which is at least partially arranged adjacent to the bottom plane 160 of the recess 120 along a projection into the substrate 110 along the direction 150 such that the mesa 140 is accessible by charge carriers avoiding the doped region 230. Here, one again, the doped regions 230 do not extend into the projection of the mesa 140 into the substrate 110. However, in other embodiments, the doped regions 230 may extend into the previously-mentioned projection of the mesa 140.

Similar to the drain contact 410, the FET 500 also comprises at a back side 220 of the substrate 110 a drain contact 510 which may be formed by a metal to name just one alternative. The drain contact 510 is once again arranged on the counter electrode 280, which is once again formed by a highly n-doped semiconducting material (n+).

The FET 500 further comprises a drift area 210 comprising the semiconducting material of the first conductivity type. In the example shown in FIG. 7, it is implemented as a lowly n-doped layer. The drift area 210 is arranged along the direction 150 into the substrate 110 between the drain contact 510 and the electrically-conductive structure 180.

The FET 500 further comprises a source region 520 electrically coupled to the electrically-conductive structure 185. It comprises the semiconducting material of the first conductivity type. Here, it is implemented as a highly n-doped region. The FET 500 further comprises a body region 530 comprising the semiconducting material of the second conductivity type. The body region 530, which is also referred to as body only, is implemented here as a lowly p-doped region. It is arranged along the direction 150 into the substrate 110 between the source region 520 and the drift area 210.

Furthermore, the FET 500 comprises a gate contact 540 arranged in a trench 550 extending into the substrate 110. The gate contact 540 is electrically insulated from the source region 520, the body region 530 and the drift area 210 by an insulating film 560 covering at least partially a sidewall 570 and a bottom 580 of the trench 550. The source region 520 is arranged in a direction perpendicular to the direction 150 into the substrate 110 between the trench 550 and the doped region 230. The channel region 530 is at least partially arranged in the direction perpendicular to the direction 150 into the substrate 110 between the trench 550 and the doped region 230.

Once again, the mesa 140 along with the electrically-conductive material 180 forms the Schottky diode 310. Therefore, FIG. 7 shows a SiC trench MOSFET 500 with a monolithic integration of a three-dimensional SiC Schottky diode 310. As outlined in context with FIG. 6, the electrically-conductive structure 185 may be implemented as a metal contact for the source and the body diode.

Also in the case of the FET 500 according to an embodiment, the previously-described doping concentrations concerning the Schottky diode 310 may be implemented as outlined in the context of FIGS. 1 to 5.

Devices may comprise a plurality of any of the above-mentioned and described structures and circuit elements, which may be coupled in parallel, depending on the desired currents and other parameters. For instance, such a device may comprise a plurality of trenches 130, recesses 120 and mesas 140, which may be coupled in parallel. However, also a series connection or more complex connections may be implemented. Moreover, such a device may comprise a termination (e.g. a JTE; junction termination extension).

The description and drawings merely illustrate the principles of embodiments. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

Functional blocks denoted as "means for . . . " (performing a certain function) shall be understood as functional blocks comprising circuitry that is adapted for performing or to perform a certain function, respectively. Hence, a "means for s.th." may as well be understood as a "means being adapted or suited for s.th.". A means being adapted for performing a certain function does, hence, not imply that such means necessarily is performing said function (at a given time instant).

The methods, for instance fabrication processes, described herein may be implemented as software or with the help of software, for instance, as a computer program. The sub-processes may be performed by such a program by, for instance, writing into a memory location. Similarly, reading or receiving data may be performed by reading from the same or another memory location. A memory location may be a register or another memory of an appropriate hardware. The functions of the various elements shown in the Figures, including any functional blocks labeled as "means", "means for forming", "means for determining" etc., may be provided through the use of dedicated hardware, such as "a former", "a determiner", etc. as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included. Similarly, any switches shown in the Figures are conceptual only. Their function may be carried out through the operation of program logic, through dedicated logic, through the interaction of program control and dedicated logic, the particular technique being selectable by the implementer as more specifically understood from the context.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective steps of these methods.

Further, it is to be understood that the disclosure of multiple steps or functions disclosed in the specification or claims may not be construed as to be within the specific order. Therefore, the disclosure of multiple steps or functions will not limit these to a particular order unless such steps or functions are not interchangeable for technical reasons.

Furthermore, in some embodiments a single step may include or may be broken into multiple substeps. Such substeps may be included and part of the disclosure of this single step unless explicitly excluded.

What is claimed is:

1. A semiconductor device at least partially arranged in or on a substrate, the semiconductor device comprising:
   a recess forming a mesa, the mesa extending along a direction into the substrate to a bottom plane of the recess, the mesa comprising a semiconducting material of a first conductivity type, the semiconducting material of the mesa comprising at least locally a first doping concentration not extending further into the substrate than the bottom plane;
   a doped region of a second conductivity type arranged at least partially adjacent to the bottom plane of the recess along a projection of the recess into the substrate such that the mesa is accessible by charge carriers avoiding the doped region;
   a further doped region of the first conductivity type arranged along a projection of the mesa into the substrate and in a direction perpendicular to the projection adjacent to the doped region; and
   an electrically conductive structure arranged at least partially along a sidewall of the mesa, the electrically conductive structure forming a Schottky or Schottky-like electrical contact with the semiconducting material of the mesa,
      wherein the substrate comprises the semiconducting material of the first conductivity type comprising at least locally a second doping concentration different from the first doping concentration along a projection of the mesa into the substrate.

2. The semiconductor device according to claim 1, wherein the first doping concentration is higher than the second doping concentration.

3. The semiconductor device according to claim 1, wherein the semiconductor material comprising the second doping concentration is part of a drift area for charge carriers.

4. The semiconductor device according to claim 1, wherein the semiconductor material comprising the second doping concentration is arranged adjacent to the semiconductor material of the mesa with the first doping concentration.

5. The semiconductor device according to claim 1, wherein the doped region extends into a projection of the mesa into the substrate.

6. The semiconductor device according to claim 1, wherein the further doped region comprises a third doping concentration, the third doping concentration being larger than the first doping concentration and the second doping concentration.

7. The semiconductor device according to claim 1, wherein the further doped region extends further into the substrate than the doped region of the second conductivity type and below the doped region of the second conductivity type.

8. The semiconductor device according to claim 1, wherein the recess comprises an electrical contact structure arranged on the bottom plane of the recess and configured to electrically couple the doped region of the second conductivity type to the electrically conductive structure.

9. The semiconductor device according to claim 1, wherein the recess comprises an electrically insulating structure arranged partially along the sidewall of the recess at the bottom plane.

10. The semiconductor device according to claim 1, wherein the mesa comprises a top surface, wherein the electrically conductive structure is further arranged on top of the top surface of the mesa forming an upper part of the Schottky or Schottky-like electrical contact with the semiconducting material of the mesa, and wherein the electrically conductive structure arranged on the sidewall of the mesa forms a lower part of the Schottky or Schottky-like electrical contact.

11. The semiconductor device according to claim 10, wherein the Schottky or Schottky-like electrical contact is configured to comprise a diode-like characteristic with a threshold voltage in a forward-biased state, wherein the upper part of the Schottky or Schottky-like electric contact comprises a diode-like characteristic with a lower threshold voltage than the lower part of the Schottky or Schottky-like electric contact.

12. The semiconductor device according to claim 1, wherein the mesa comprises a height along a direction into the substrate and a width perpendicular to the direction into the substrate, and wherein the height is at least equal to the width.

13. The semiconductor device according to claim 1, wherein the semiconductor device is configured such that in a reverse-biased state of the Schottky or Schottky-like electric contact an electric field strength along the sidewall of the mesa is essentially constant along a portion of the sidewall comprising at least 50% a height along a direction into the substrate of the sidewall.

14. The semiconductor device according to claim 1, wherein the Schottky or Schottky-like electrical contact comprises a characteristic reverse electric field strength in a reverse-biased state, wherein the semiconductor device is configured to cause a depletion of charge carriers in an area along a projection of the mesa into the substrate such that, when a pinch-off voltage in the range of 5 V to 50 V is applied to the electrically conductive structure and a counter electrode such that the Schottky or Schottky-like electrical contact is in the reverse-biased state, the characteristic reverse electric field strength at the Schottky or Schottky-like electrical contact is not exceeded.

15. The semiconductor device according to claim 1, wherein the semiconducting material is a Silicon Carbide (SiC).

16. The semiconductor device according to claim 15, wherein the sidewall is parallel to at least one of a $(112\bar{\;}0)$-plane and a $(11\bar{\;}00)$-plane.

17. The semiconductor device according to claim 1, wherein an electric field at the sidewall at a normal operating voltage is at most 30% of a maximum electric field below the bottom plane.

\* \* \* \* \*